United States Patent [19]

Nguyen

[11] Patent Number: 5,524,422
[45] Date of Patent: Jun. 11, 1996

[54] MATERIALS WITH LOW MOISTURE OUTGASSING PROPERTIES AND METHOD OF REDUCING MOISTURE CONTENT OF HERMETIC PACKAGES CONTAINING SEMICONDUCTOR DEVICES

[75] Inventor: My N. Nguyen, San Diego, Calif.

[73] Assignee: Johnson Matthey Inc., Wayne, Pa.

[21] Appl. No.: 431,685

[22] Filed: May 2, 1995

Related U.S. Application Data

[60] Continuation of Ser. No. 187,797, Jan. 25, 1994, abandoned, which is a division of Ser. No. 32,679, Mar. 17, 1993, abandoned, which is a continuation-in-part of Ser. No. 843,735, Mar. 28, 1992, Pat. No. 5,195,299.

[51] Int. Cl.$^6$ .............................. B65B 51/02; C08K 3/08; C08G 73/00
[52] U.S. Cl. ............................ 53/477; 524/440; 528/422; 528/423; 252/511; 252/514
[58] Field of Search ..................................... 524/439, 440; 252/512, 514; 528/422, 423; 53/477

[56] References Cited

U.S. PATENT DOCUMENTS

| | | | |
|---|---|---|---|
| 1,743,167 | 1/1930 | Styer | 174/14 R |
| 2,895,270 | 7/1959 | Blaess | 53/411 |
| 3,586,926 | 6/1971 | Nakamura et al. | 257/682 |
| 3,595,900 | 7/1971 | Loudas et al. | 528/422 |
| 4,280,885 | 7/1981 | Savery | 204/129 |
| 4,369,302 | 1/1983 | Ikeguchi et al. | 528/119 |
| 4,375,498 | 3/1983 | Le Minez et al. | 428/416 |
| 4,401,776 | 8/1983 | Munk | 523/443 |
| 4,552,690 | 11/1985 | Ikeguchi et al. | 252/512 |
| 4,604,452 | 8/1986 | Shimp | 528/422 |
| 4,608,434 | 8/1986 | Shimp | 528/422 |
| 4,699,888 | 10/1987 | Dumesnil et al. | 501/19 |
| 4,709,008 | 11/1987 | Shimp | 528/422 |
| 4,732,702 | 3/1988 | Yamazaki et al. | 252/512 |
| 4,740,343 | 4/1988 | Gaku et al. | 524/439 |
| 4,740,584 | 4/1988 | Shimp | 528/422 |
| 4,740,830 | 4/1988 | Ketley | 357/67 |
| 4,785,075 | 11/1988 | Shimp | 528/422 |
| 4,831,086 | 5/1989 | Das et al. | 528/422 |
| 4,839,442 | 6/1989 | Craig, Jr. | 528/422 |
| 4,847,233 | 7/1989 | Shimp | 502/171 |
| 4,861,823 | 8/1989 | Qureshi | 524/606 |
| 4,902,752 | 2/1990 | Shimp | 525/390 |
| 4,931,545 | 6/1990 | Shimp et al. | 528/422 |
| 4,940,848 | 7/1990 | Shimp | 528/422 |
| 4,983,683 | 1/1991 | Shimp | 525/390 |
| 4,999,699 | 3/1991 | Christie et al. | 357/65 |
| 5,002,818 | 3/1991 | Licari et al. | 428/209 |
| 5,037,691 | 8/1991 | Medney et al. | 428/137 |
| 5,068,309 | 11/1991 | Shimp | 528/211 |
| 5,114,003 | 5/1992 | Jackisch et al. | 206/204 |
| 5,143,785 | 9/1992 | Pujol et al. | 252/514 |
| 5,149,863 | 9/1992 | Shimp et al. | 560/301 |
| 5,150,195 | 9/1992 | Nguyen et al. | 357/72 |
| 5,155,066 | 10/1992 | Nguyen | 437/209 |
| 5,162,574 | 11/1992 | Craig, Jr. | 560/301 |
| 5,195,299 | 3/1993 | Nguyen | 53/428 |
| 5,215,860 | 6/1993 | McCormick et al. | 528/422 |
| 5,250,600 | 10/1993 | Nguyen | 524/377 |
| 5,261,157 | 11/1993 | Chang | 29/844 |
| 5,330,684 | 7/1994 | Emori et al. | 252/512 |
| 5,358,992 | 10/1994 | Dershem et al. | 528/422 |

FOREIGN PATENT DOCUMENTS

| | | |
|---|---|---|
| 3423385 | 1/1985 | Germany. |
| 0153338 | 9/1983 | Japan. |
| 2285968 | 12/1987 | Japan. |
| 3069883 | 3/1988 | Japan. |

OTHER PUBLICATIONS

D. A. Shimp and W. M. Craig, Jr., "New Liquid Dicyanate Monomer for Rapid Impregnation of Reinforcing Fibers," 34th International SAMPE Symposium, 1989.

Hi–Tek Polymers, "AroCy® Cyanate Enter Safety and Handling Bulletin, AroCy® Safety and Handling".

Hans Steinegger, "Smart Cards: Bonding Technology at its Limits," Microelectronics Mfg. Tech., Dec. 1992, pp. 13–15.

D. A. Shimp, et al., "AroCy® Cyanate Ester Resin, Chemistry, Properties and Applications," Rhone–Poulenc, Inc.; Jan. 1990, pp. 1–36.

E. Grigat and R. Putter, "New Methods of Preparative Organic Chemistry VI—Synthesis and Reactions of Cyanic Esters," Agnew. Chem. Internat. Edit., vol. 6, Nov. 3, 1967, pp. 206–216.

Hi–Tek Polymers, "AroCy® L–10 Cyanate Ester Monomer," Oct. 1989.

Hi–Tek Polymers, "ArCy® Cyanate Ester Resins".

Hi–Tek Polymers, "AroCy® F–40S Cyanate Ester Resin Solution," Apr. 1989.

Hi–Tek Polymers, "AroCy® B–10 Cyanate Ester Monomer," Oct. 1988.

Hi–Tek Polymers, "AroCy® B–40S Cyanate Ester Resin Solution," Oct. 1988.

Hi–Tek Polymers, "AroCy® B–50 Cyanate Ester Hard Resin," Oct. 1988.

Hi–Tek Polymers, "AroCy® M–10 Cyanate Ester Monomer," Oct. 1988.

Hi–Tek Polymers, "AroCy® M–30 Cyanate Ester Semisolid Resin," Oct. 1988.

Hi–Tek Polymers, "AroCy® M–40S Cyanate Ester Resin Solution," Oct. 1988.

Hi–Tek Polymers, "AroCy® M–50 Cyanate Ester Hard Resin," Oct. 1988.

Hi–Tek Polymers, "AroCy® T–30 Cyanate Ester Semisolid Resin," Oct. 1988.

Allied Signal Inc., "Primaset—PT Resins, Safety and Handling Bulletin," Mar. 20, 1992.

Allied Signal Inc., "Primaset—PT Resins".

Allied–Signal Inc., "Primaset—PT Resins, Literature List".

Tactix Performance Polymers, "XU–71787.02, XU–71787.07, Developmental Polycyanate Resins for Advanced Composites and Adhesives".

(List continued on next page.)

*Primary Examiner*—Tae Yoon
*Attorney, Agent, or Firm*—Christie, Parker & Hale

[57] ABSTRACT

Low-moisture outgassing of hermetic packages can be achieved with a monomer having at least one OCN functional group.

10 Claims, 2 Drawing Sheets

OTHER PUBLICATIONS

Sajal Das, "Phenol–Triazine (PT) Resin, A New Family of High Performance Thermosets" Cyanate Ester Symposium, Apr. 9–10, 1992.

D. A. Shimp and S. J. Ising, "Moisture Effects and their Control in the Curing of Polycyanate Resins," Cyanate Ester Symposium, Apr. 9–10, 1992.

S. L. Simon and J. K. Gillham, "Cure of a Dicyanate Ester/Polycyanurate System," Cyanate Ester Symposium, Apr. 9–10, 1992.

Fraunhofer Institut for Angewandte Materialforschung, "Polycyanurates and Their Modifications, State of the Art and New Aspects," Gordon Research Conference on Thermoset, Jun. 1993.

Hi–Tek Polymers, "AroCy® Resins," Dec. 1988.

David Shimp and Mark Southcott, "Controlling Moisture Effects During the Curing of High $T_G$ Cyanate Ester/Aramid Composites," 38th International Symposium and Exhibition, May 10–13, 1993.

Rhône–Poulenc, "Specialty Resins—Reactive Rubber Tougheners for AroCy® Cyanate Ester Resins," Jan. 1991.

Rhône–Poulenc, "Specialty Resins—Pyrolysis of AroCy® Cyanate Esters".

Rhône–Poulenc, "Specialty Resins—Quantative Determination of Residual Cyanate in Cured Homopolymers Via FTIR Analysis," Jan. 2, 1992.

Rhône–Poulenc, "Specialty Resins—Compatibility of Cyanate Esters with Aramid Reinforcements and Polyamide/Imide Substrates".

Rhône–Poulenc, "Specialty Resins—AroCy® L–10 Cyanate Ester Monomer," Sep. 1990.

Rhône–Poulenc, "Specialty Resins—AroCy® F–10 Cyanate Ester Monomer," Sep. 1990.

Rhône–Poulenc, "Specialty Resins—AroCy® M–20 Low Viscosity Prepolymer," Sep. 1990.

Rhône–Poulenc, "Specialty Resins—AroCy® B–10 Cyanate Ester Monomer," Oct. 1990.

Rhône–Poulenc, "Specialty Resins—Toxicity of AroCy® Cyanate Esters".

Rhône–Poulenc, "Specialty Resins—AroCy® M–10 Cyanate Ester Monomer," Sep. 1990.

Rhône–Poulenc, "Specialty Resins—AroCy® Cyanate Ester Resins".

Rhône–Poulenc, "Specialty Resins—AroCy® Cyanate Ester Resins" list.

Rhône–Poulenc, "Specialty Resins—AroCy® F–40S Cyanate Ester Resin Solution," Jul. 1990.

Rhône–Poulenc, "Specialty Reins—AroCy® B–30 Cyanate Ester Semisolid Resin".

Rhône–Poulenc, "Specialty Resins—AroCy® B–40S Cyanate Ester Resin Solution," Aug. 1990.

Rhône–Poulenc, "Specialty Resins—AroCy® B–50 Cyanate ester Hard Resin," Sep. 1990.

Rhône–Poulenc, "Specialty Resins—AroCy® M–40S Cyanate Ester Resin Solution," Aug. 1990.

Rhône–Poulenc, "Specialty Resins—AroCy® M–30 Cyanate Ester Semisolid Resin," Sep. 1990.

Rhône–Poulenc, "Specialty Resins—AroCy® M–50 Cyanate Ester Hard Resin," Sep. 1990.

Rhône–Poulenc, "Specialty Resins—AroCy® Cyanate Ester Safety and Handling Bulletin," Sep. 1990.

Rhône–Poulenc, "Specialty Resins—Formulating AroCy® Cyanate Esters for Resin Transfer Molding Applications," Apr. 1991.

Rhône–Poulenc, "Specialty Resins—AroCy® Cyanate Ester Adhesives for Polyimide Flexible Circuitry," Jan. 1991.

Rhône–Poulenc, "Galvanic Corrosion of Carbon Fiber Composites," Jan. 1991.

Hi–Tek Polymers, "REX–378 Developmental Cyanate Ester Prepolymer".

Uri Sela and Hans Steinegger, "Dispensing Technology—The Key to High–Quality, High–Speed Die Bonding," *Microelectronics Manufacturing Technology*, Feb. 1991, pp. 47–52.

Jack R. Christenson and David A. Shimp, "Improvements in Performance and Processing Using Cyanate Ester Blends and Alloys," Ultralloy '90, pp. 191–208.

Tony del Rosario, "JM 7000 Low Temperature Die Attach Material Qualification Report," Olin Interconnect Technologies, Dec. 10, 1992.

Malcolm L. White, et al., "Attaining Low Moisture Levels in Hermetic Packages," *IEEE/Proc. IRPS*, 1982, pp. 253–259.

David P. Galloway and My N. Nguyen, "A New, Reliable Snap Cure Die Attach Adhesive," *Mat. Res. Soc. Symp. Proc.* vol. 264, 1992, pp. 271–280.

Sue Oliver, et al., "Silver/Polymer Die Attach for Ceramic Package Assembly," 1992 IEPS meeting, Sep. 27–30, 1992.

My N. Nguyen and Michael B. Grosse, "Low Moisture Polymer Adhesive for Hermetic Packages," *IEEE Trans. on Components, Hybrids and Manufacturing Technology*, vol. 15, No. 6, Dec. 1992, pp. 964–971.

Richard H. Estes, "A Practical Approach to Die Attach Adhesive Selection," *Hybrid Circuit Technology*, Jun. 1991.

Tom Ramsey and Gail Heinen, "Controlling Moisture to Ceramic Packages," *Semiconductor International*, Aug. 1988.

Mitsubishi Gas Chemical Company, Inc., "High Heat Resistant BT Resin—Bismaleimide–Triazine Resin," Fourth Edition, Sep. 1, 1984.Sue Oliver, "Qualification Status and Extended Stressing of JM7000 Silver/Polymer Die Attach Adhesive for Ceramic Package Assembly," Jan. 12, 1993.

Hi–Tek Polymers, "AroCy® F–10 Cyanate Ester Monomer," Apr. 1989.

Hi–Tek Polymers, "AroCy® B–30 Cyanate Ester Semisolid Resin," Oct. 1988.

Andrew Rosenbaum, "Smarter and Smarter," Electronics, Oct. 1991, 32D & 32E.

Daniel Webb, "What Future is in the PC Cards?" Electronic Business, Nov. 4, 1991, p. 11.

"Japan Challenges Intel's Lead in Flash Memories," attached chart World EPROM Market, Semiconductors.

M. Bauer, J. Bauer and G. Kühn, "Kinetics and modelling of thermal polycyclotrimerization of aromatic dicyanates," Acta Polymerica 37 (1986), Nr. 11/12, pp. 715–719.

Fig. 1  CURING REACTIONS
MONOMER FUNCTIONAL GROUP  −O−C≡N−
FORMATION OF TRIAZINE RING
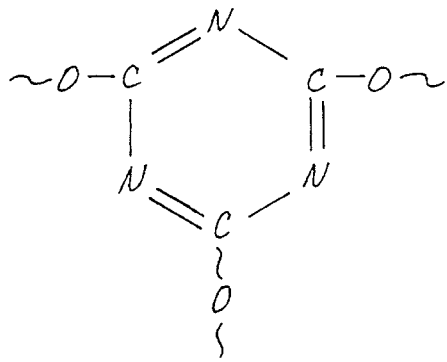
Fig. 2
(1) DICYANATE MONOMER
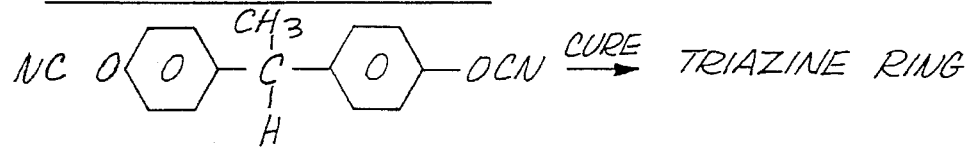
Fig. 3
(2) BISMALIMIDE-TRIAZINE
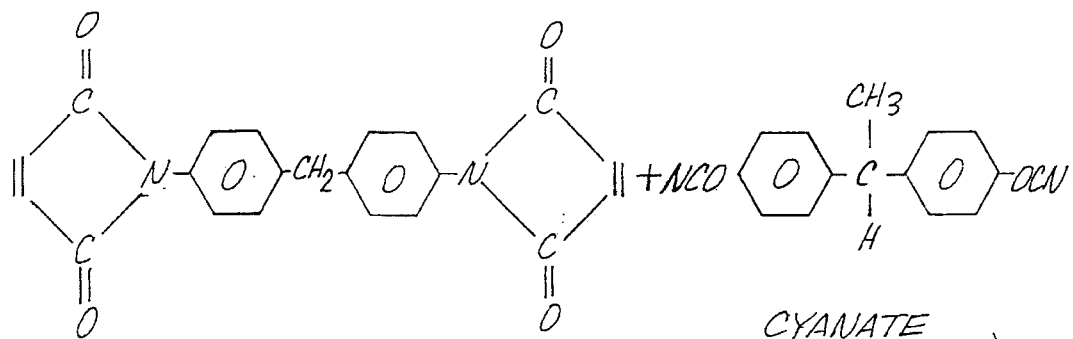
BISMALIMIDE
CURING
{ (1) TRIAZINE RINGS
(2) TRIAZINE IMIDAZOLE
(3) OXAZOLE }
CYANATE
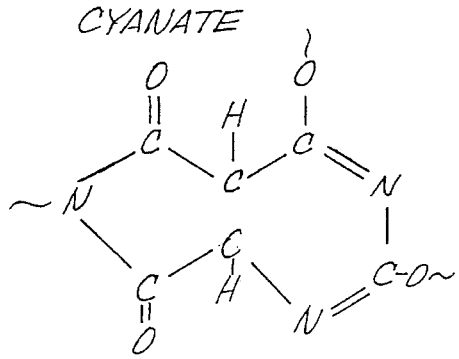

Fig. 4
(3) MULTIFUNCTIONAL PHENOLIC TRIAZINE
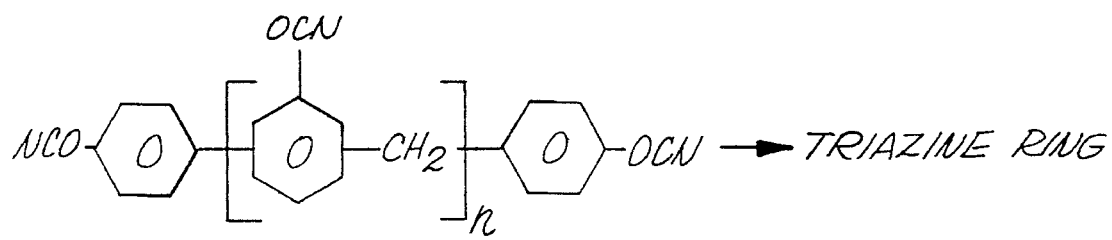
→ TRIAZINE RING
Fig. 5
MECHANISM FOR LOW MOISTURE OUTGASSING
(A) CYANATE REACTS WITH MOISTURE TO FORM CARBAMATE
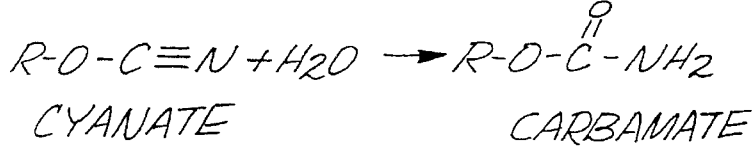
CYANATE            CARBAMATE
(B) AT TEMP, e.g., > 200°C
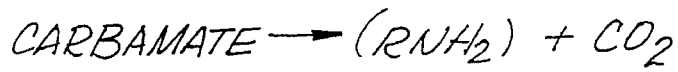

MATERIALS WITH LOW MOISTURE OUTGASSING PROPERTIES AND METHOD OF REDUCING MOISTURE CONTENT OF HERMETIC PACKAGES CONTAINING SEMICONDUCTOR DEVICES

CROSS-REFERENCE TO RELATED APPLICATIONS

This application is a continuation of application Ser. No. 08/187,797 filed Jan. 25, 1994, now abandoned, which is a division of application Ser. No. 08/032,679 filed Mar. 17, 1993, now abandoned which is a continuation-in-part of application Ser. No. 07/843,735 filed Feb. 28, 1992, now U.S. Pat. No. 5,195,299 issued Mar. 23, 1993.

FIELD OF THE INVENTION

The present invention relates to a method of reducing the water moisture content in a hermetic package containing a semiconductor device to minimize the possibility of damage to the semiconductor device which may be caused by the presence of water in the package.

BACKGROUND OF THE INVENTION

Hermetic packages for semiconductor devices are typically ceramic packages sealed with caps or lids using glass or metal seals. Hermetic sealing is employed to prevent entry into the package of undesirable chemicals which could damage the semiconductor device contained therein. However, the presence of moisture, even in very small or trace amounts, within the hermetic package can also damage the semiconductor device. To avoid any damage to the semiconductor device from moisture contained within the package after hermetic sealing, it is necessary to have the moisture content less than 5,000 ppm, otherwise moisture induced corrosion failure of the semiconductor device may result.

One of the sources of moisture in the package can be the inorganic adhesive used to attach the semiconductor device to a substrate. To avoid the possibility of introducing moisture to the package from the adhesive, inorganic adhesive such as silver filled glass paste have been used. These adhesives do not release moisture upon heating for curing. However, common die attach adhesive containing polymers, epoxy, polyimide, etc., give off moisture upon heating for curing and therefore cannot be used where low moisture conditions within the hermetic package are required.

The present invention provides a method of reducing the water moisture content in a hermetic package containing a semiconductor device to prevent damage to the semiconductor.

SUMMARY OF THE INVENTION

According to the present invention there is provided materials with low moisture outgassing properties which generally comprise monomers with at least one OCN functional group. In order to have good adhesiveness to ceramic substrates and to be capable of rapid curing, it is desirable to include a curing catalyst. The monomer containing an OCN functional group must also be reactive with moisture so that the moisture content of a package to be hermetically sealed can be reduced as the OCN group is polymerized to produce a low moisture resin upon curing. It is also possible to use a partially polymerized monomer with an OCN group as well as an unpolymerized monomer for this purpose. The low moisture outgassing material may be formulated as an adhesive composition by blending with reactive diluents and incorporating in addition to a curing catalyst other known components which aid in imparting rapid curability to the composition such as metal curing catalyst, alkylphenols, etc. Presently preferred monomers with OCN groups include bismaleimide-triazine and phenolic triazine.

BRIEF DESCRIPTION OF THE DRAWINGS

FIGS. 1 to 4 are diagrams of curing reactions for (1) the monomer function group —O—C≡N— and the formation of a triazine ring; (2) dicyanate monomer; (3) bismaleimide-triazine; and (4) multifunctional phenolic triazine.

FIG. 5 is a diagram of the mechanism for low-moisture outgassing.

DETAILED DESCRIPTION OF THE INVENTION

The moisture content of a hermetic package may be reduced by incorporating therein a small but effective amount of a resin that contains a least one functional group (O—C≡N) having low moisture characteristics. Such material may be conventionally incorporated in the hermetic package as an adhesive in which case it should include a curing catalyst to assure that the adhesive composition is capable of being rapidly cured. Where a blended composition is used it is important to form a homogeneous mixture before curing.

The resin containing at least one OCN functional group may additionally be blended with reactive diluents which will also maintain low moisture properties. The reactive diluents may additionally assist in controlling or adjusting viscosity and facilitating the reaction with the OCN group of the monomer to form a thermally stable network to maintain thermal stability. As an adhesive formulation, the composition should be adjusted so that it may be cured rapidly, i.e., within less than five minutes at 200° C. Other filler materials such as thermal and/or electrical conductive fillers as are known for die attach adhesives may be included as well.

It has been determined that all resins that contain the functional group (O—C≡N) have very low moisture outgassing during curing and subsequent processes. During the curing reaction, all resins with this functional group form some type of polytriazine network. Examples of suitable commercially available resins are: Dicyanate monomers, i.e., supplied by Ciba Geigy (formerly Rhone-Poulenc and Hi-Tek); bismaleimide-triazine available from Mitsubishi Gas Chemical, which is similar to dicyanate, and multifunction phenolic triazine, available from Allied Signal and Ciba Geigy. The curing reaction is of the polymerization type with two main constituents, bismalimide and triazine. The resin is cured by heating without evolution of gas by forming triazine rings, triazine-imidazole rings, oxazole rings, etc. and multifunctional phenolic triazine. All cyanate esters are cured by additional polymerization. There are no outgassing byproducts in the reaction. The repeated unit of the cured polymer has the same molecular weight as the monomer, i.e., the monomer is not split up. Curing reactions of the above-described resins are shown in FIGS. 1–4.

The mechanism for low moisture outgassing is shown in FIG. 5. As indicated the cyanate reacts with moisture to form a carbamate and at temperatures about 200° C. the carbamate reacts to produce carbon dioxide.

In addition to the foregoing, resins containing at least one OCN group, as described above, can be blended with other compatible polymer resins and still maintain low moisture characteristics. Resins that are compatible include the following:

Epoxy—conventional epoxy curing reaction yields unacceptably high levels of moisture during curing. However, by blending as little as 20% of a resin containing at least one OCN functional group, the moisture outgassing can be reduced to acceptable levels.

Polyester (saturated), polyether.

Diene rubbers—acrylonitrile butadiene rubber, acryl rubber, polybutadiene, polyvinyl butyral, high polymer natural resins.

Thermoplastics—including polyetherimide, polysulfone, polyether sulfone, polyarylate, polyimide, polyimidesiloxane.

In addition to the foregoing, monomers containing at east one OCN functional group may be blended with diluents. For example, to adjust the viscosity the resin may be blended with suitable diluents while still maintaining the low moisture characteristics. Typical diluents useful for adjusting viscosity include:

Acrylic acid esters, such as trimethylolpropane trimethacrylate, trimethylolpropane triacrylate, polyethyleneglycol dimethacrylate, etc.

Triallyl isocyanurate, diallyl phthalate, castor oil.

Glycidylethers.

As can be seen from the foregoing, resins that contain at least one functional group OCN yielded low moisture characteristics. Also, blends of such resins with compatible polymers will also result in compositions with low moisture characteristics as do blends of the resin with reactive diluents.

A convenient form of the material is as an adhesive formulation which can then accomplish the dual purpose of serving as an adhesive to bond the hermetically sealed package as well as to incorporate the low moisture material in the package. Examples of die attach adhesive formulations of this kind appear below. The electrically and/or thermally conductive filler in an amount not to exceed 90 wt. % may also be present.

EXAMPLES OF DIE-ATTACH ADHESIVE FORMULATIONS

|  | A | B | C |
|---|---|---|---|
| Dicyanate (LIO) | 20 | | |
| Bismaleimide Triazine (BT 3109) | | 20 | |
| Phenolic Triazine (PT 30) | | | 20 |
| Copper Naphthenate | 0.01 | 0.01 | 0.01 |
| Silver Flake | 80 | 80 | 80 |
| Total | 100 | 100 | 100 |
| Evaluation: 600 × 600 MIL Die Attached on Alumina | | | |
| Adhesive Strength (lbs) | >800 | >800 | >800 |
| Cavity Moisture (ppm) (RGA) | 100 | 280 | 170 |

Note
the cavity moisture level for A, B and C are equivalent and well exceeded military specification of <5000 ppm

BLENDS OF CYANATE ESTER WITH OTHER RESINS

1) EPOXY: EXAMPLES OF ADHESIVE FORMULATION

| EXAMPLE | D | E | 100% Epoxy |
|---|---|---|---|
| Cyanate Resin | 10 | 5 | |
| Epoxide Resin | 10 | 15 | |
| AG Flake | 80 | 80 | |
| Copper Naphthenate | 0.01 | 0.01 | |
| Total | 100 | 100 | |
| Evaluation: 600 × 600 MIL DIE Attached on Alumina | | | |
| Adhesive Strength (lb) | >800 | >800 | 400 |
| Cavity Moisture (ppm) (RGA | 1500 | 2500. | 50000 |

Note:
Examples D & E will meet the military specification requirement, while the 100% epoxy does not.

| Example | F | G | H |
|---|---|---|---|
| Cyanate Resin | 15 | 15 | 15 |
| Polyester | 15 | | |
| Acrylonitrile Butadiene | | 15 | |
| Polyimidesiloxane | | | 15 |
| Copper Naphthenate | 0.01 | 0.01 | 0.01 |
| AG Flake | 70 | 70 | 70 |
| Total | 100 | 100 | 100 |
| Adhesive Strength (lbs) | >800 | >800 | >800 |
| Cavity Moisture (ppm) | 500 | 700 | 600 |

Cavity moisture reduced by blending cyanate resin.

BLENDS OF CYANATE WITH DILUENTS

| Example | I | J | K |
|---|---|---|---|
| Cyanate Resin | 6.5 | 9 | 7.5 |
| Trially Isocyanurate | | 9 | 3.75 |
| Trimethylolpropane Trimethacrylate | 6.5 | | 3.75 |
| Cu Naphthenate | 0.01 | 0.01 | 0.01 |
| AG Flake | 87 | 87 | 85 |
| Total | 100 | 100 | 100 |
| Evaluations 600 × 600 MIL DIE on Alumina | | | |
| Adhesive Strength (lb) | >800 | >800 | >800 |
| Cavity Moisture (ppm) | 172 | 288 | 456 |

I, J & K still maintained low moisture.

It is apparent from the foregoing that various changes and modifications may be made without departing from the invention. Accordingly, the scope of the invention should be limited only by the appended claims wherein what is claimed is:

What is claimed is:

1. A method of reducing the moisture and increasing the carbon dioxide content of a hermetic package comprising incorporating in a hermetic package a small but effective amount of a composition comprising an organic compound with at least one functional group O—C≡N capable of forming a triazine ring and/or a triazine imidazole upon curing and an electrically and/or thermally conductive filler in an amount not to exceed 90 wt. %, reacting the functional group with moisture in the package to reduce the moisture content in the package to less than about 5000 ppm and form an intermediate compound, and heating the intermediate compound to at least about 200° C. to release carbon dioxide within the package.

2. A method according to claim 1 wherein said organic compound with at least one functional group O—C≡N is present in an adhesive formulation.

3. A method as claimed in claim 1 wherein the die attach adhesive comprises a resin vehicle comprising cyanate ester monomers; and thermally or electrically conductive filler.

4. A method as claimed in claim 3 wherein the thermally or electrically conductive filler comprises silver particles.

5. A method as claimed in claim 4 wherein the silver is present in an amount of about 70 weight percent to about 90 weight percent.

6. A method as claimed in claim 3, wherein the die attach adhesive composition further comprises a metal curing catalyst.

7. A method as claimed in claim 3, wherein the resin vehicle further comprises at least one diluent.

8. A method as claimed in claim 7, wherein the diluent is selected from the group of acrylic acid esters, triallyl isocyanurate, diallyl phthalate, castor oil and glycidylethers and mixtures thereof.

9. A method of reducing the moisture and increasing the carbon dioxide content of a hermetic package comprising incorporating in the hermetic package an adhesive formulation including an organic compound with at least one functional group O—C≡N capable of forming a triazine ring and/or a triazine imidazole upon curing, an electrically and/or thermally conductive filler in an amount not to exceed 90 wt. %, a metal curing catalyst and an alkylphenol, reacting the O—C≡N functional group with moisture in the package to form an intermediate compound, and heating the intermediate compound to at least about 200° C. to release carbon dioxide within the package.

10. A method of reducing the moisture content of a hermetic package according to claim 9 wherein the adhesive formulation includes at least one compound from the group consisting of polyetherimide, polysulfone, polyether sulfone, polyarylate, polyimide, and polyimidesiloxane.

* * * * *

UNITED STATES PATENT AND TRADEMARK OFFICE
CERTIFICATE OF CORRECTION

PATENT NO. : 5,524,422
DATED : June 11, 1996
INVENTOR(S) : My N. Nguyen

It is certified that error appears in the above-indentified patent and that said Letters Patent is hereby corrected as shown below:

Title page,
Item [56] References Cited, OTHER PUBLICATIONS, page 2, change "Rhône-Poulenc, "Specialty Resins-AroCy® M-20 Low Vicosity Prepolymer," Sep. 1990" to -- Rhône-Poulenc, "Specialty Resins-AroCy® M-20 Low Melt Viscosity Prepolymer," Sep. 1990 --.

Column 3, line 19, delete "east" and insert therefor -- least --.
Column 4, line 17, below the line "Total 100  100  100" insert
    -- Evaluations: 600 X 600 MIL SI DIE Attached on Alumina --.
Column 4, line 25, change "Trially Isocyanurate" to -- Triallyl Isocyanurate --.
Column 4, lines 55,56, delete "die attach adhesive" and insert therefor
    -- composition --.
Column 4, line 66, delete "claim 3" and insert therefor -- claim 1 --.
Column 4, lines 66,67, delete "resin vehicle" and insert therefor -- composition --.
Column 6, line 8, delete "includes" and insert therefor -- further comprises --.
Column 6, line 8, delete "compound" and insert therefor -- resin --.

Signed and Sealed this

Twenty-fifth Day of February, 1997

Attest:

BRUCE LEHMAN

*Attesting Officer*        *Commissioner of Patents and Trademarks*